US011192348B2

(12) United States Patent
Han et al.

(10) Patent No.: US 11,192,348 B2
(45) Date of Patent: Dec. 7, 2021

(54) LIGHT SHIELDING TAPE, METHOD OF MANUFACTURING THE SAME, AND DISPLAY DEVICE INCLUDING THE SAME

(71) Applicant: SAMSUNG DISPLAY CO., LTD., Yongin-si (KR)

(72) Inventors: Sang Sun Han, Suwon-si (KR); Kyu-Tae Park, Hwaseong-si (KR); Jungil Lee, Seoul (KR); Jiheon Lee, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 139 days.

(21) Appl. No.: 16/361,934

(22) Filed: Mar. 22, 2019

(65) Prior Publication Data
US 2019/0315104 A1 Oct. 17, 2019

(30) Foreign Application Priority Data

Apr. 12, 2018 (KR) .......................... 10-2018-0042933

(51) Int. Cl.
| B32B 7/12 | (2006.01) |
| B32B 27/20 | (2006.01) |
| H05K 5/00 | (2006.01) |
| H05K 5/02 | (2006.01) |
| B32B 5/02 | (2006.01) |
| B32B 7/06 | (2019.01) |
| B32B 27/12 | (2006.01) |

(52) U.S. Cl.
CPC .............. *B32B 27/20* (2013.01); *B32B 5/028* (2013.01); *B32B 7/06* (2013.01); *B32B 7/12* (2013.01); *B32B 27/12* (2013.01); *H05K 5/0017* (2013.01); *H05K 5/0217* (2013.01); *B32B 2307/41* (2013.01); *B32B 2307/412* (2013.01); *B32B 2307/73* (2013.01); *B32B 2307/732* (2013.01); *B32B 2405/00* (2013.01); *C09J 2203/318* (2013.01); *Y10T 428/1476* (2015.01); *Y10T 428/2848* (2015.01)

(58) Field of Classification Search
None
See application file for complete search history.

(56) References Cited

U.S. PATENT DOCUMENTS

| 7,399,527 B2 * | 7/2008 | Miyano ...................... C09J 7/29 428/354 |
| 7,402,336 B2 * | 7/2008 | Yokoyama ................. C09J 7/29 428/354 |
| 7,514,142 B2 * | 4/2009 | Husemann ................. C09J 7/35 428/354 |
| 8,349,448 B2 * | 1/2013 | Yokoyama ................ B32B 7/12 428/354 |
| 2004/0028895 A1 * | 2/2004 | Yamakami ................. C09J 7/29 428/354 |
| 2006/0110537 A1 * | 5/2006 | Huang ..................... B08B 17/06 427/299 |
| 2009/0120574 A1 * | 5/2009 | Husemann .............. B32B 27/08 156/306.6 |
| 2012/0206940 A1 * | 8/2012 | Han ....................... G02B 6/0068 362/609 |
| 2016/0085007 A1 * | 3/2016 | Akizuki ................. G02B 5/305 428/216 |

FOREIGN PATENT DOCUMENTS

| JP | 5891663 | 3/2016 |
| KR | 10-1452181 | 10/2014 |
| KR | 10-1580492 | 12/2015 |
| KR | 10-1627679 | 6/2016 |
| KR | 10-1707581 | 2/2017 |
| KR | 10-1788571 | 10/2017 |

OTHER PUBLICATIONS

Definition of "Cloth" from the Cambridge English Dictionary, retrieved on Mar. 10, 2021 (Year: 2021).*
"Understanding Fabric Grain", UK Cooperative Extension Service, University of Kentucky College of Agriculture, Jan. 2006 (Year: 2006).*
Machine translation of KR20170003787A, Jan. 10, 2017 (Year: 2017).*

* cited by examiner

*Primary Examiner* — Anish P Desai
(74) *Attorney, Agent, or Firm* — F. Chau & Associates, LLC

(57) ABSTRACT

A light shielding tape includes a first adhesive layer, a textile base layer disposed on the first adhesive layer, a resin base layer disposed on the textile base layer, and a first light shielding layer disposed on the resin base layer. The first light shielding layer includes black pigment.

14 Claims, 5 Drawing Sheets

LIGHT SHIELDING TAPE, METHOD OF MANUFACTURING THE SAME, AND DISPLAY DEVICE INCLUDING THE SAME

CROSS-REFERENCE TO RELATED APPLICATION(S)

This application claims priority under 35 U.S.C. § 119 to Korean Patent Application No. 10-2018-0042933, filed on Apr. 12, 2018 in the Korean Intellectual Property Office (KIPO), the disclosure of which is incorporated by reference herein in its entirety.

TECHNICAL FIELD

Exemplary embodiments of the present invention relate to a light shielding tape. More particularly, exemplary embodiments of the present invention relate to a light shielding tape, a method of manufacturing the light shielding tape, and a display device including the light shielding tape.

DISCUSSION OF THE RELATED ART

A flat panel display (FPD) device such as a liquid crystal display (LCD), an organic light emitting diode (OLED) display, a plasma display panel (PDP), an electrowetting display, an electrophoretic display, a microelectromechanical system (MEMS) display, etc. has been replacing a conventional cathode ray tube (CRT) because a flat panel display can provide, for example, a slim size, a light-weight, low power consumption, etc.

The liquid crystal display (LCD) device may be widely used in various electronic devices such as notebooks, monitors, televisions, smartphones, personal media players, navigation devices, etc. The liquid crystal display device might not include self-emissive elements thereby requiring an additional light source such as a backlight unit. Accordingly, a backlight unit that includes a light emitting diode (LED), etc. may be disposed on a rear surface of the liquid crystal display device. The backlight unit may emit light toward a front surface of the liquid crystal display device, and an image may be provided in the display region of the liquid crystal display device. Some of the light supplied to a liquid crystal panel by the backlight unit may be emitted to a region outside of the display region of the liquid crystal panel, so that a light shielding tape to prevent the light from being leaked to the display region may be used.

SUMMARY

According to an exemplary embodiment of the present invention, a light shielding tape includes: a first adhesive layer; a textile base layer disposed on the first adhesive layer; a resin base layer disposed on the textile base layer; and a first light shielding layer disposed on the resin base layer. The first light shielding layer includes black pigment.

In an exemplary embodiment of the present invention, the light shielding tape further includes a second light shielding layer disposed between the resin base layer and the textile base layer. The second light shielding layer includes black pigment.

In an exemplary embodiment of the present invention, the resin base layer is substantially transparent.

In an exemplary embodiment of the present invention, the resin base layer includes black pigment.

In an exemplary embodiment of the present invention, the first adhesive layer includes black pigment.

In an exemplary embodiment of the present invention, the light shielding tape further includes a second adhesive layer disposed between the textile base layer and the resin base layer.

In an exemplary embodiment of the present invention, the light shielding tape further includes a hydrophobic layer disposed on the first light shielding layer.

In an exemplary embodiment of the present invention, the light shielding tape further includes a release layer disposed on the first adhesive layer.

In an exemplary embodiment of the present invention, the light shielding tape further includes a first area configured to attach to a first surface of an object and a second area configured to attach to a second surface of the object adjacent to the first surface. The textile base layer includes a plurality of grains extending to cross one another, and the plurality of grains extend along a diagonal direction with respect to a boundary line extending between the first area and the second area.

In an exemplary embodiment of the present invention, the first area and the second area are symmetrical about the boundary line.

According to an exemplary embodiment of the present invention, a method of manufacturing a light shielding tape includes: forming a light shielding layer includes black pigment on at least one surface of a resin base layer; combining the resin base layer and a textile base layer; and forming an adhesive layer on the textile base layer.

In an exemplary embodiment of the present invention, forming the light shielding layer includes coating a first light shielding layer including black pigment on a first surface of the resin base layer; and coating a second light shielding layer including black pigment on a second surface of the resin base layer opposite to the first surface.

In an exemplary embodiment of the present invention, the resin base layer is disposed on the textile base layer.

In an exemplary embodiment of the present invention, forming the adhesive layer includes: forming the adhesive layer on a release layer; and combining the textile base layer and the release layer such that the adhesive layer is in contact with the textile base layer.

In an exemplary embodiment of the present invention, the light shielding tape includes a first area configured to attach to a first surface of an object and a second area configured to attach to a second surface of the object adjacent to the first surface. The textile base layer includes a plurality of grains extending to cross one another. The method further includes cutting the light shielding tape such that the plurality of grains extend along a diagonal direction with respect to a boundary line extending between the first area and the second area.

According to an exemplary embodiment of the present invention, a display device includes a display panel displaying an image; a chassis including a first sub-chassis covering a first side surface of the display panel and a second sub-chassis covering a second side surface of the display panel adjacent to the first side surface; and a light shielding tape covering the first sub-chassis and the second sub-chassis adjacent to the first sub-chassis. The light shielding tape includes: a first adhesive layer disposed on the chassis; a textile base layer disposed on the first adhesive layer; a resin base layer disposed on the textile base layer; and a first light shielding layer disposed on the resin base layer. The first light shielding layer includes black pigment.

In an exemplary embodiment of the present invention, the light shielding tape further includes a second light shielding layer disposed between the resin base layer and the textile base layer. The second light shielding layer includes black pigment.

In an exemplary embodiment of the present invention, the light shielding tape further includes a first area overlapping the first sub-chassis and a second area overlapping the second sub-chassis. The textile base layer includes a plurality of grains extending to cross one another, and the plurality of grains extend along a diagonal direction with respect to a boundary line extending between the first area and the second area.

In an exemplary embodiment of the present invention, a gap is formed between the first sub-chassis and the second sub-chassis, and the light shielding tape covers the gap.

According to an exemplary embodiment of the present invention, a light shielding tape includes: a first adhesive layer; a textile base layer disposed on the first adhesive layer and including a first plurality of grains extending in a first direction and a second plurality of grains extending in a second direction crossing the first direction; a resin base layer disposed on the textile base layer; and a first light shielding layer disposed on the resin base layer.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawing, wherein.

DETAILED DESCRIPTION OF THE EMBODIMENTS

Hereinafter, exemplary embodiments of the present invention will be described more fully hereinafter with reference to the accompanying drawings.

Hereinafter, a light shielding tape according to an exemplary embodiment of the present invention will be described with reference to FIGS. 1, 2, and 3.

Figure 1:
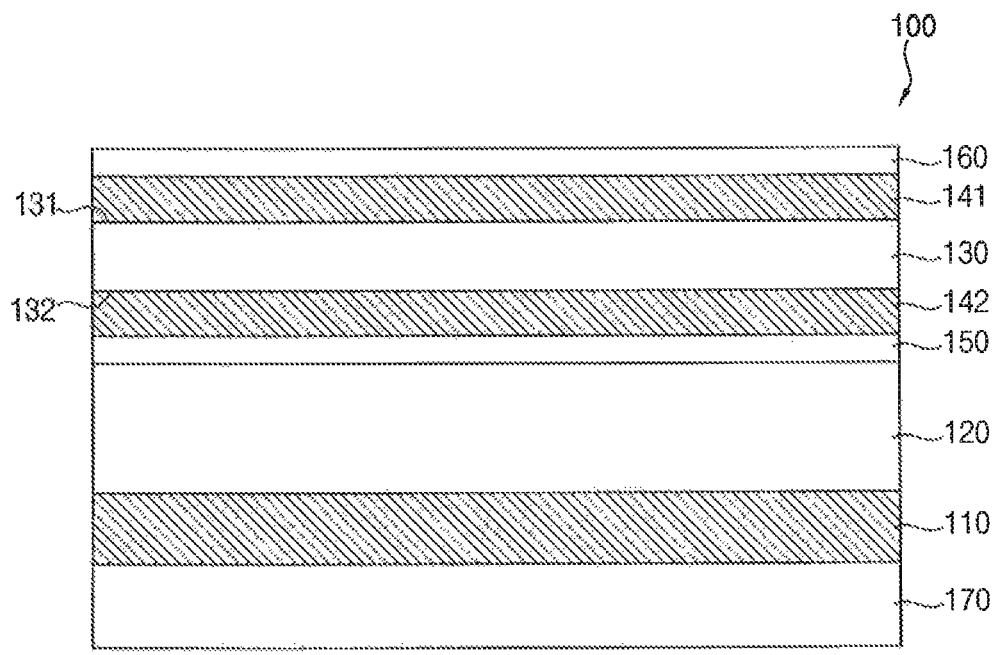
FIG. 1 is a cross-sectional view illustrating a light shielding tape according to an exemplary embodiment of the present invention.

FIG. 1 is a cross-sectional view illustrating a light shielding tape according to an exemplary embodiment of the present invention.

Referring to FIG. 1, a light shielding tape 100 according to an exemplary embodiment of the present invention may include a first adhesive layer 110, a textile base layer 120, a resin base layer 130, a first light shielding layer 141, a second light shielding layer 142, a second adhesive layer 150, an anti-fingerprint layer 160, and a release layer 170.

The textile base layer 120 may be disposed on the first adhesive layer 110. The first adhesive layer 110 may attach the light shielding tape 100 to an object.

The first adhesive layer 110 may have a dark color. For example, the first adhesive layer 110 may be black. Accordingly, the first adhesive layer 110 may block light as well as attach the light shielding tape 100 to the object. For example, although cracks may occur in the first light shielding layer 141 and/or the second light shielding layer 142 due to a tensile stress applied to the resin base layer 130, the first adhesive layer 110 having a black color may block light.

The first adhesive layer 110 may include a black ink and an adhesive agent. For example, the black ink may include a black pigment such as carbon black, phenylene black, aniline black, cyanine black, nigrosine acid black, or the like. For example, the adhesive agent may include, for example, acryl-based resin, silicon-based resin, urethane-based resin, ether-based resin, rubber-based resin, or the like.

The first adhesive layer 110 may have a predetermined adhesive strength. For example, the first adhesive layer 110 may have an adhesive strength greater than a certain magnitude, so that the light shielding tape 100 may adhere to the object. As an additional example, the first adhesive layer 110 may have an adhesive strength greater than about 2500 gf.

A thickness of the first adhesive layer 110 may be in a range from about 20 μm to about 40 μm. For example, the thickness of the first adhesive layer 110 may be about 30 μm. If the thickness of the first adhesive layer 110 is less than about 20 μm, the adhesive strength of the first adhesive layer 110 may decrease, and the light shielding tape 100 may be detached from the object. If the thickness of the first adhesive layer 110 is greater than about 40 μm, the adhesive strength of the first adhesive layer 110 might not increase, and a thickness of the light shielding tape 100 may increase thereby decreasing flexibility of the light shielding tape 100.

The textile base layer 120 may include a plurality of textile bases including, for example, a natural fabric or a synthetic fabric having a mesh shape. For example, the textile base layer 120 may have a structure in which three textile bases are layered, and the textile base may be about 7-denier in fineness. A thickness of the textile base layer 120 may be in a range from about 30 μm to about 40 μm. For example, the thickness of the textile base layer 120 may be about 33 μm. The textile base layer 120 may be formed of the textile bases that have a relatively high flexibility, so that the light shielding tape 100 may be easily attached to a curved object or a corner of an object.

The resin base layer 130 may be disposed on the textile base layer 120. The resin base layer 130 may include resin such as polyester, polyethylene, polyethylene terephthalate (PET), or the like. In an exemplary embodiment of the present invention, a thickness of the resin base layer 130 may be in a range from about 10 μm to about 20 μm. For example, the thickness of the resin base layer 130 may be about 12 μm.

In an exemplary embodiment of the present invention, the resin base layer 130 may be transparent. The resin base layer 130 may be formed of resin that might not contain coloring material, so that size, stability and strength of the resin base layer 130 may be increased.

In an exemplary embodiment of the present invention, the resin base layer 130 may be partially or substantially transparent.

In an exemplary embodiment of the present invention, the resin base layer 130 may have a dark color. For example, the resin base layer 130 may be black. For example, the resin base layer 130 may include black pigment. For example, the resin base layer 130 may include coloring material such as carbon black, phenylene black, aniline black, cyanine black, nigrosine acid black, or the like. Because the resin base layer 130 is black, the amount of light blocked by the light shielding tape 100 may be increased. Further, although cracks may occur in the first light shielding layer 141 and/or the second light shielding layer 142 due to a tensile stress applied to the resin base layer 130, the resin base layer 130 may block light.

The first light shielding layer 141 may be disposed on the resin base layer 130. The second light shielding layer 142 may be disposed between the textile base layer 120 and the resin base layer 130. For example, the first light shielding layer 141 may be disposed on a first surface 131 of the resin base layer 130, and the second light shielding layer 142 may be disposed on a second surface 132 of the resin base layer 130 opposite to the first surface 131. For example, the first surface 131 and the second surface 132 of the resin base layer 130 may be an upper surface and a lower surface of the resin base layer 130, respectively.

Each of the first light shielding layer 141 and the second light shielding layer 142 may include a binder resin and a black ink. For example, the binder resin may include polyurethane (PU) resin, polyester resin, polyvinyl resin, acrylic resin, polyvinylpyrrolidone (PVP) resin, or the like. As an additional example, the black ink may include a black pigment such as carbon black, phenylene black, aniline black, cyanine black, nigrosine acid black, or the like.

Each of the first light shielding layer 141 and the second light shielding layer 142 may have a thickness in a range from about 4 μm to about 5 μm. If the thickness of each of the first light shielding layer 141 and the second light shielding layer 142 is less than about 4 μm, the amount of light blocked may be reduced so that the light shielding tape 100 may transmit some light. If the thickness of each of the first light shielding layer 141 and the second light shielding layer 142 is greater than about 5 μm, a light shielding effect might not increase, and a thickness of the light shielding tape 100 may increase. For example, the amount of light blocked by the light shielding tape 100 may remain substantially the same.

The second adhesive layer 150 may be disposed between the textile base layer 120 and the resin base layer 130. For example, the second adhesive layer 150 may be disposed between the textile base layer 120 and the second light shielding layer 142. The second adhesive layer 150 may combine the textile base layer 120 and the resin base layer 130 to one another.

A thickness of the second adhesive layer 150 may be less than about 3 μm. For example, the thickness of the second adhesive layer 150 may be about 2 μm. The second adhesive layer 150 may have a thickness less than about 3 μm, so that an increase of a thickness of the light shielding tape 100 may be minimized.

The anti-fingerprint layer 160 may be disposed on the first light shielding layer 141. For example, the anti-fingerprint layer 160 may be disposed on an upper surface of the first light shielding layer 141 thereby possibly preventing pollutants from outside from being attached to the light shielding tape 100.

The anti-fingerprint layer 160 may include, for example, hydrophobic material such that a pollutant such as a liquid pollutant may be easily removed from the anti-fingerprint layer 160. For example, the anti-fingerprint layer 160 may include fluorine based high polymer, silicon based high polymer, fluorine based surfactant, etc. The anti-fingerprint layer 160 may have a thickness of about 1 μm. In an exemplary embodiment of the present invention, the anti-fingerprint layer 160 may include nano patterns.

The release layer 170 may be disposed on the first adhesive layer 110. For example, the release layer 170 may be disposed below the first adhesive layer 110. For example, the release layer 170 may be opposite to the textile base layer 120 with the first adhesive layer 110 disposed therebetween. The release layer 170 may protect the first adhesive layer 110 from, for example, outside pollutants or materials. The light shielding tape 100 may be attached to an object via the first adhesive layer 110 after removing the release layer 170. For example, the release layer 170 may include polyethylene terephthalate (PET), etc.

The light shielding tape 100 according to an exemplary embodiment of the present invention may have a thickness less than a predetermined magnitude. For example, the thickness of the light shielding tape 100 may be less than about 90 μm. Here, the thickness of the light shielding tape 100 may be the combined thicknesses of the thickness of the first adhesive layer 110, the thickness of the textile base layer 120, the thickness of the second adhesive layer 150, the thickness of the second light shielding layer 142, the thickness of the resin base layer 130, the thickness of the first light shielding layer 141, and the thickness of the anti-fingerprint layer 160. Because the thickness of the light shielding tape 100 is less than about 90 μm, an increase in a repulsive force due to bending of the light shielding tape 100 may be minimized when the light shielding tape 100 is attached to a curved object or a corner of an object. The light shielding tape 100 may be attached and adhered to the curved object and a corner of an object.

Figure 2:
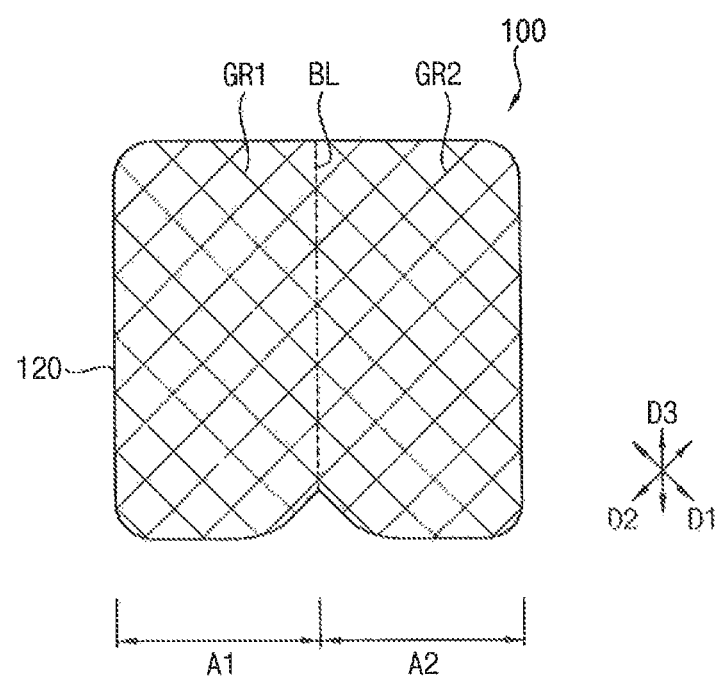
FIG. 2 is a plan view illustrating the light shielding tape in FIG. 1 according to an exemplary embodiment of the present invention.

FIG. 2 is a plan view illustrating the light shielding tape 100 in FIG. 1 according to an exemplary embodiment of the present invention.

Referring to FIG. 2, the light shielding tape 100 according to an exemplary embodiment of the present invention may include a first area A1 and a second area A2 in a plan view. The second area A2 may be adjacent to the first area A1. A boundary line BL may be provided between the adjacent first and second areas A1 and A2. For example, the boundary line BL may be a substantially straight line.

In an exemplary embodiment of the present invention, the first area A1 and the second area A2 of the light shielding tape 100 may have symmetrical shapes to each other with respect to the boundary line BL. For example, when the light shielding tape 100 is folded along the boundary line BL, the first area A1 and the second area A2 may completely overlap to each other. As an additional example, the first area A1 and the second area A2 may be aligned with each other. FIG. 2 illustrates that a planar shape of the light shielding tape 100 in which corners of the light shielding tape 100 are rounded and a side portion of the light shielding tape 100 is dented between the first area A1 and the second area A2. However, the present invention is not limited thereto. The light shielding tape 100 may have various planar shapes. For example, the light shielding tape 100 may have another dented area between the first area A1 and the second area A2 in another side portion of the light shielding tape 100.

In an exemplary embodiment of the present invention, the light shielding tape 100 may be configured to be attached to an object including surfaces adjacent to each other. For example, the object may include a first surface and a second surface adjacent to the first surface. Further, the object may have a three-dimensional shape, and therefore, an edge may be formed between the first surface and the second surface. In this case, the first area A1 and the second area A2 of the light shielding tape 100 may be attached to the first surface and the second surface of the object, respectively. Further, the boundary line BL between the first area A1 and the second area A2 of the light shielding tape 100 may correspond to the edge between the first surface and the second surface of the object. Accordingly, the light shielding tape 100 may be folded according to the boundary line BL when being attached to the object.

The textile base layer 120 may include a plurality of grains GR1 and GR2 that may extend in different directions from each other such that they cross each other in a plan view. For example, the textile base layer 120 may include a plurality of first grains GR1 extending in parallel with a first direction D1 and a plurality of second grains GR2 extending in parallel with a second direction D2 crossing the first direction D1. For example, the first direction D1 and the second direction D2 may be perpendicular to each other.

In an exemplary embodiment of the present invention, the grains GR1 and GR2 of the textile base layer 120 may extend in a diagonal direction with respect to the boundary line BL. The boundary line BL may extend in parallel with a third direction D3. The first direction D1 and the second direction D2, which extend along the grains GR1 and GR2 of the textile base layer 120, may form an angle with the third direction D3. Angles between the grains GR1 and GR2 of the textile base layer 120 and the boundary line BL may be greater than 0 degrees and less than 90 degrees. For example, the angles between the grains GR1 and GR2 of the textile base layer 120 and the boundary line BL may be about 45 degrees.

When the boundary line BL of the light shielding tape 100 is located corresponding to the edge of the object, a tensile stress may be applied to a region of the textile base layer 120 corresponding to the boundary line BL. For example, if the grains of the textile base layer extend in parallel with the boundary line BL, the textile base layer may be torn along the grains due to the tensile stress. However, in the light shielding tape 100 according to an exemplary embodiment of the present invention, the grains GR1 and GR2 of the textile base layer 120 may extend in a diagonal direction with respect to the boundary line BL. Therefore, the textile base layer 120 might not be torn due to the tensile stress applied along the boundary line BL when the light shielding tape 100 is attached to the object.

Figure 3:
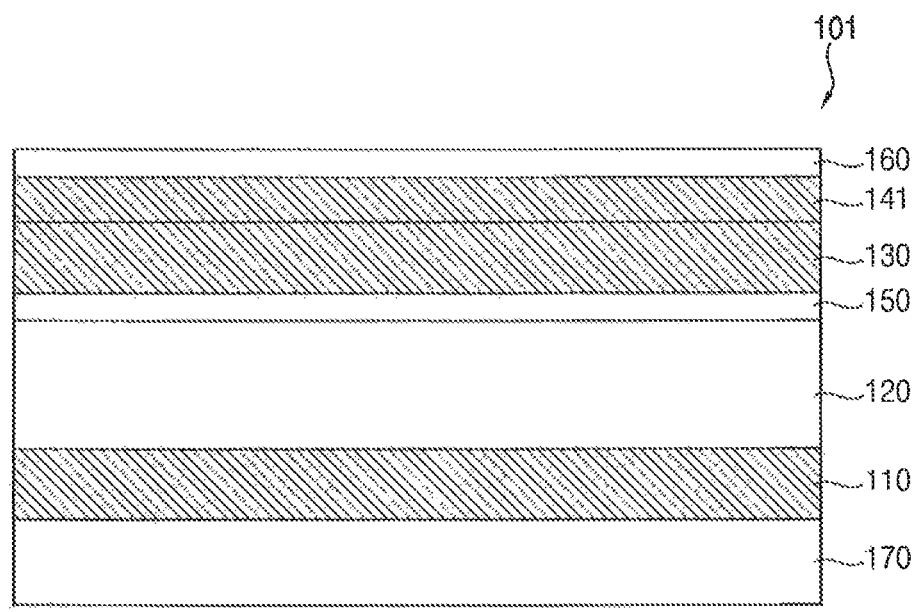
FIG. 3 is a cross-sectional view illustrating a light shielding tape according to an exemplary embodiment of the present invention.

FIG. 3 is a cross-sectional view illustrating a light shielding tape according to exemplary embodiment of the present invention.

Referring to FIG. 3, a light shielding tape 101 according to an exemplary embodiment of the present invention may include a first adhesive layer 110, a textile base layer 120, a resin base layer 130, a first light shielding layer 141, a second adhesive layer 150, an anti-fingerprint layer 160, and a release layer 170. Detailed descriptions on elements of the light shielding tape 101 according to an exemplary embodiment of the present invention with reference to FIG. 3, which may be substantially the same as or similar to those of the light shielding tape 100 according to an exemplary embodiment of the present invention with reference to FIG. 1, may be omitted.

The first light shielding layer 141 may be disposed on the resin base layer 130. For example, the first light shielding layer 141 may be disposed on a first surface of the resin base layer 130. For example, the first surface of the resin base layer 130 may be an upper surface of the resin base layer 130. Contrary to the light shielding tape 100 according to an exemplary embodiment of the present invention described with reference to FIG. 1, the light shielding tape 101 according to an exemplary embodiment present invention might not include the second light shielding layer 142 in FIG. 1.

The first light shielding layer 141 may include a binder resin and a black ink. For example, the binder resin may include polyurethane (PU) resin, polyester resin, polyvinyl resin, acrylic resin, polyvinylpyrrolidone (PVP) resin, or the like. Further, the black ink may include a black pigment such as carbon black, phenylene black, aniline black, cyanine black, nigrosine acid black, or the like.

The first light shielding layer 141 may have a thickness in a range from about 4 μm to about 5 μm. If the thickness of the first light shielding layer 141 is less than about 4 μm, the amount of light that is shielded may be reduced so that the light shielding tape 101 may transmit some light. If the thickness of the first light shielding layer 141 is greater than about 5 μm, the amount of light shielded might not be increased, and a thickness of the light shielding tape 101 may increase.

In an exemplary embodiment of the present invention, the resin base layer 130 may be black. For example, the resin base layer 130 may include coloring material such as carbon black, phenylene black, aniline black, cyanine black, nigrosine acid black, or the like. Because the resin base layer 130 is black, light may be blocked by the resin base layer 130 and the first light shielding layer 141 although the light shielding tape 101 does not include the second light shielding layer 142 in FIG. 1.

In an exemplary embodiment of the present invention, a thickness of the resin base layer 130 may be in a range from about 20 μm to about 30 μm. For example, the thickness of the resin base layer 130 may be about 25 μm. Although the light shielding tape 101 does not include the second light shielding layer 142 in FIG. 1, the thickness of the resin base layer 130 included in the light shielding tape 101 according to an exemplary embodiment of the present invention may be greater than the thickness of the resin base layer 130 included in the light shielding tape 100 according to an exemplary embodiment of the present invention in FIG. 1, so that light may be blocked by the resin base layer 130 and the first light shielding layer 141.

Hereinafter, a method of manufacturing a light shielding tape according to an exemplary embodiment of the present invention will be described with reference to FIGS. 1, 2, 4, 5, and 6.

Figure 4:
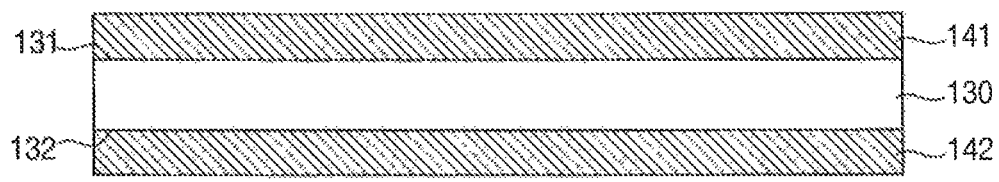
FIGS. 4, 5, and 6 are cross-sectional views illustrating a method of manufacturing a light shielding tape according to an exemplary embodiment of the present invention.
Figure 5:
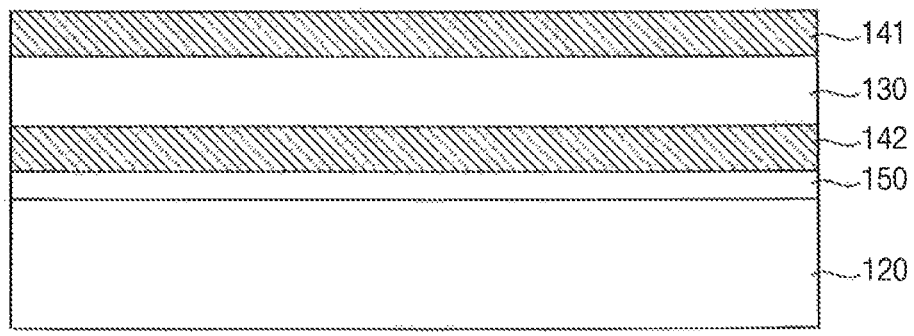
Figure 6:
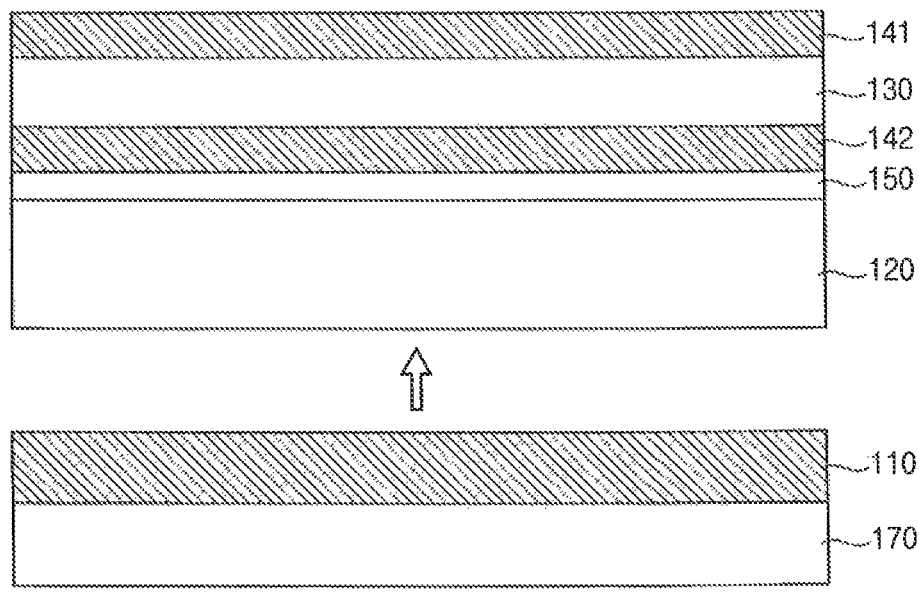

FIGS. 4, 5, and 6 are cross-sectional views illustrating a method of manufacturing a light shielding tape according to an exemplary embodiment of the present invention.

Referring to FIG. 4, a light shielding layer having a black color may be formed on at least one surface of the resin base layer 130. In an exemplary embodiment of the present invention, the first light shielding layer 141 may be formed on the first surface 131 of the resin base layer 130, and the second light shielding layer 142 may be formed on the second surface 132 of the resin base layer 130. For example, the first surface 131 is opposite the second surface 132.

In an exemplary embodiment of the present invention, the first light shielding layer 141 may be coated on the first surface 131 of the resin base layer 130, and the second light shielding layer 142 may be coated on the second surface 132 of the resin base layer 130. For example, a binder resin and a black ink may be applied on each of the first surface 131 and the second surface 132 of the resin base layer 130 by a coating method such as gravure coating, knife coating, spray coating, deep coating, spin coating, screen coating, inkjet printing, pad printing, kiss coating, etc. to form the first light shielding layer 141 and the second light shielding layer 142 on the resin base layer 130.

The first light shielding layer 141 and the second light shielding layer 142 may be formed on the first surface 131 and the second surface 132 of the resin base layer 130, respectively, as illustrated in FIG. 4. However, the present invention is not limited thereto. In an exemplary embodiment of the present invention, the light shielding layer 141 may be formed only on the first surface 131 of the resin base layer 130 as illustrated in FIG. 3, or the light shielding layer may be formed only on the second surface 132 of the resin base layer 130.

In an exemplary embodiment of the present invention, the light shielding layer 141 may formed on only one of the first surface 131 or second surface 132 of the resin base layer 130, and the second light shielding layer 142 may be omitted.

Referring to FIG. 5, the resin base layer 130 and the textile base layer 120 may be combined. For example, the second adhesive layer 150 may be interposed between the textile base layer 120 and the resin base layer 130 on which the first light shielding layer 141 and the second light shielding layer 142 are coated, so that the resin base layer 130 and the textile base layer 120 may be attached to each other.

In an exemplary embodiment of the present invention, the resin base layer 130 and the textile base layer 120 may be attached to each other in a lamination method. Accordingly, a thickness of the second adhesive layer 150 may be less than about 3 μm, and an increase of a thickness of the light shielding tape 100 may be minimized.

Referring to FIG. 6, the first adhesive layer 110 may be formed on the textile base layer 120. For example, the first adhesive layer 110 may be formed on one surface of the textile base layer 120 opposite to the other surface of the textile base layer 120 on which the second adhesive layer 150 is formed. As an additional example, the first adhesive layer 110 may be formed on a lower surface of the textile base layer 120, and the second adhesive layer 150 may be formed on an upper surface of the textile base layer 120.

In an exemplary embodiment of the present invention, the first adhesive layer 110 may be formed on the release layer 170, and the resin base layer 130 and the release layer 170 may be combined such that the first adhesive layer 110 is in contact with the textile base layer 120. For example, the release layer 170 on which the first adhesive layer 110 is formed may be combined to the resin base layer 130 by using a lamination roll, etc.

Referring to FIG. 1, the anti-fingerprint layer 160 may be formed on the first light shielding layer 141. In an exemplary embodiment of the present invention, the anti-fingerprint layer 160 may be formed on the first light shielding layer 141 by depositing a hydrophobic material on the first light shielding layer 141.

Referring to FIG. 2, the light shielding tape 100 may be cut in a certain planar shape. For example, the light shielding tape 100 may be cut such that the first area A1 and the second area A2 divided in a plan view by the boundary line BL are symmetrical to each other with respect to the boundary line BL.

In an exemplary embodiment of the present invention, the light shielding tape 100 may be cut such that the boundary line BL extends in a diagonal direction with respect to the grains GR1 and GR2 of the textile base layer 120. For example, the light shielding tape 100 may be cut such that the boundary line BL is at an angle with respect to the grains GR1 and GR2 of the textile base layer 120 at about 45 degrees in a plan view.

Hereinafter, a display device according to an exemplary embodiment of the present invention will be described with reference to FIGS. 7 and 8.

Figure 7:
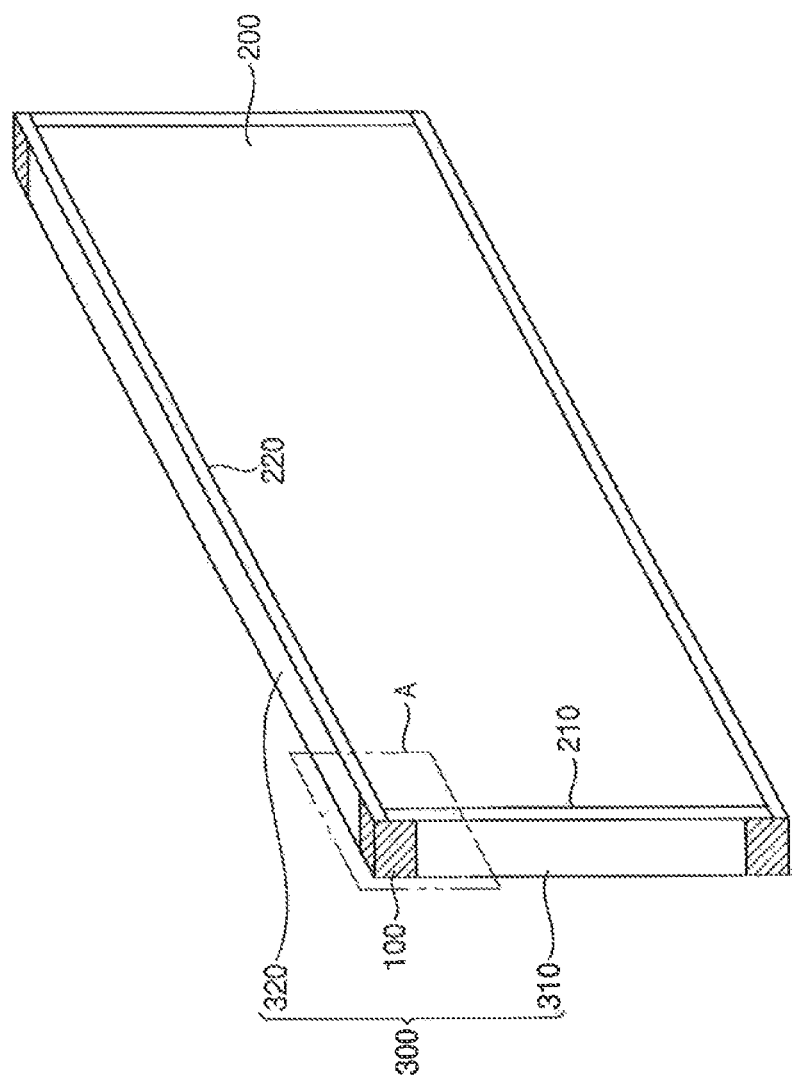
FIG. 7 is a perspective view illustrating a display device according to an exemplary embodiment of the present invention.

FIG. 7 is a perspective view illustrating a display device according to an exemplary embodiment of the present invention. FIG. 8 is a plan view illustrating an area A in FIG. 7 according to an exemplary embodiment of the present invention.

Figure 8:
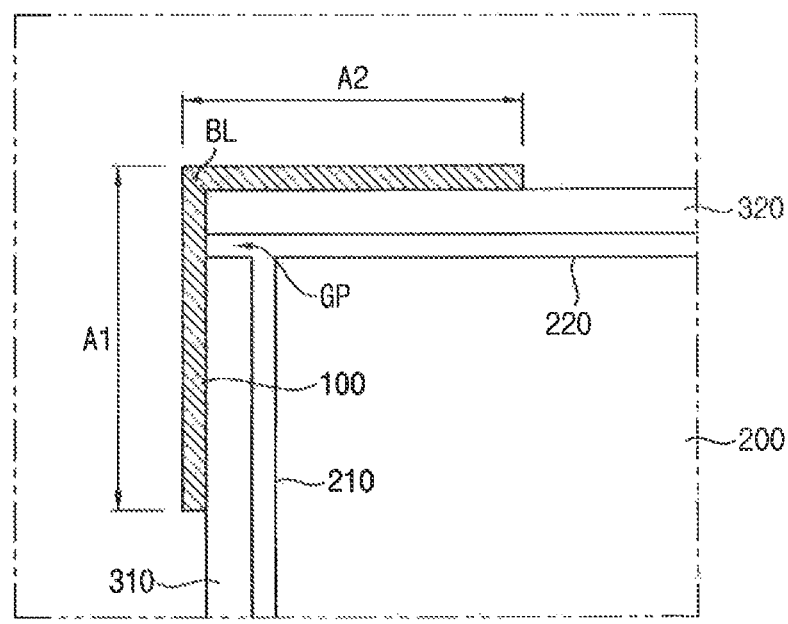
FIG. 8 is a plan view illustrating an area A in FIG. 7 according to an exemplary embodiment of the present invention.

Referring to FIGS. 7 and 8, a display device according to an exemplary embodiment of the present invention may include a display panel 200, a chassis 300, and a light shielding tape 100.

The display panel 200 may display an image. The display panel 200 may be a non-emissive display panel, which is one of various display panels such as a liquid crystal display panel, an electrowetting display panel, an electrophoretic display panel, and a microelectromechanical system (MEMS) display panel. However, the present invention is not limited thereto. For example, the display panel 200 may be an organic light emitting display panel or a plasma display panel. In this case, each of the organic light emitting display panel and the plasma display panel may emit light itself to display an image.

In an exemplary embodiment of the present invention, the display panel 200 may have a rectangular planar shape having a pair of first side surfaces 210 and a pair of second side surfaces 220. For example, the first side surfaces 210 may be opposite to each other, the second side surfaces 220 may be opposite to each other, and the first side surface 210 and the second side surface 220 may be adjacent to each other at an angle of about 90 degrees in a plan view. Accordingly, four side surfaces and four corners may be formed in the display panel 200 in a plan view.

The chassis 300 may cover the side surfaces of the display panel 200. The chassis 300 may include a plurality of sub-chassis. In an exemplary embodiment of the present invention, the chassis 300 may include a first sub-chassis 310 covering the first side surface 210 of the display panel 200 and a second sub-chassis 320 covering the second side surface 220 of the display panel 200. In this case, the chassis 300 may include two first sub-chassis 310 and two second sub-chassis 320. For example, the two first sub-chassis 310 may be opposite each other, and the two second sub-chassis 320 may be opposite each other. For example, the chassis 300 may be formed of plastic, aluminum, stainless steel, etc.

In an exemplary embodiment of the present invention, a gap may be formed between the sub-chassis adjacent to each other. For example, the gap GP may be formed between the first sub-chassis 310 and the second sub-chassis 320 adjacent to the first sub-chassis 310. When light emitted from the display panel 200 is permitted to escape through the gap GP, a leakage of light may occur.

The light shielding tape 100 may cover the first sub-chassis 310 and the second sub-chassis 320 adjacent to each other. In an exemplary embodiment of the present invention, the light shielding tape 100 may cover the gap GP between the first sub-chassis 310 and the second sub-chassis 320 adjacent to each other. The light shielding tape 100 may fix the first sub-chassis 310 and the second sub-chassis 320 to each other, and may block light from leaking between the first sub-chassis 310 and the second sub-chassis 320. In an exemplary embodiment of the present invention, the display device may include four light shielding tapes 100 covering gaps GP between the first sub-chassis 310 and the second sub-chassis 320 corresponding to four corners of the display panel 200.

The light shielding tape 100 shown in FIGS. 7 and 8 may correspond to the light shielding tape 100 according to an exemplary embodiment of the present invention described with reference to FIG. 1 or the light shielding tape 101 according to an exemplary embodiment of the present invention described with reference to FIG. 3. In this case, after removing the release layer 170 of the light shielding tape 100 or 101, the light shielding tape 100 may be attached to the chassis 300 such that the first adhesive layer 110 of the light shielding tape 100 or 101 is disposed on the chassis 300. For example, the first adhesive layer 110 may be in direct contact with at least one surface of the chassis 300.

The light shielding tape 100 may be attached to the chassis 300 such that the first area A1 of the light shielding tape 100 overlaps the first sub-chassis 310, and the second area A2 of the light shielding tape 100 overlaps the second sub-chassis 320. For example, the first area A1 of the light shielding tape 100 may correspond to the first side surface 210 of the display panel 200, and the second area A2 of the light shielding tape 100 may correspond to the second side surface 220 of the display panel 200. Accordingly, the boundary line BL of the light shielding tape 100 may correspond to the corner between the first side surface 210 and the second side surface 220 of the display panel 200.

The first sub-chassis 310 and the second sub-chassis 320 may be adjacent to each other at a predetermined angle. For example, the first sub-chassis 310 and the second sub-chassis 320 may form a substantially right angle. Therefore, the first area A1 and the second area A2 of the light shielding tape 100 may be bent at a substantially right angle. In this case, a tensile stress formed corresponding to the corner of the display panel 200 may be applied to the boundary line BL of the light shielding tape 100. However, in the display device according to an exemplary embodiment of the present invention, the grains GR1 and GR2 in FIG. 2 of the textile base layer 120 in FIG. 2 of the light shielding tape 100 may extend in a diagonal direction with respect to the boundary line BL, so that the textile base layer 120 might not be torn by the tensile stress applied along the boundary line BL. Therefore, the light shielding tape 100 may effectively block light capable of leaking from the gap GP between the first sub-chassis 310 and the second sub-chassis 320.

The light shielding tape according to exemplary embodiments of the present invention may be applied to a display device included in a computer, a notebook, a mobile phone, a smartphone, a smart pad, a portable media player (PMP), a personal digital assistant (PDA), an MP3 player, or the like.

While the present invention has been described with reference to exemplary embodiments thereof, it will be understood by those of ordinary skill in the art that various changes in form and details may be made thereto without departing from the spirit and scope of the present invention.

What is claimed is:

1. A light shielding tape comprising:
   a first adhesive layer;
   a textile base layer disposed on the first adhesive layer and including a plurality of grains;
   a resin base layer disposed on the textile base layer;
   a first light shielding layer disposed on the resin base layer, wherein the first light shielding layer includes black pigment; and
   a first area and a second area adjacent to the first area, wherein the plurality of grains extend along a diagonal direction with resect to a boundary line extending between the first area and the second area.

2. The light shielding tape of claim 1, further comprising:
   a second light shielding layer disposed between the resin base layer and the textile base layer, wherein the second light shielding layer includes black pigment.

3. The light shielding tape of claim 2, wherein the resin base layer is substantially transparent.

4. The light shielding tape of claim 1, wherein the resin base layer includes black pigment.

5. The light shielding tape of claim 1, wherein the first adhesive layer includes black pigment.

6. The light shielding tape of claim 1, further comprising:
   a second adhesive layer disposed between the textile base layer and the resin base layer.

7. The light shielding tape of claim 1, further comprising:
   a hydrophobic layer disposed on the first light shielding layer.

8. The light shielding tape of claim 1, further comprising:
   a release layer disposed on the first adhesive layer.

9. The light shielding tape of claim 1, wherein the first area is configured to attach to a first surface of an object, and the second area is configured to attach to a second surface of the object adjacent to the first surface,
   wherein the plurality of grains extend to cross one another.

10. The light shielding tape of claim 9, wherein the first area and the second area are symmetrical about the boundary line.

11. A display device comprising:
    a display panel displaying an image;
    a chassis comprising a first sub-chassis covering a first side surface of the display panel and a second sub-chassis covering a second side surface of the display panel adjacent to the first side surface; and
    a light shielding tape covering the first sub-chassis and the second sub-chassis adjacent to the first sub-chassis,
    wherein the light shielding tape comprises:
    a first adhesive layer disposed on the chassis;
    a textile base layer disposed on the first adhesive layer;
    a resin base layer disposed on the textile base layer;
    a first light shielding layer disposed on the resin base layer, wherein the first light shielding layer includes black pigment; and
    a first area overlapping the first sub-chassis and a second area overlapping the second sub-chassis,
    wherein the textile base layer comprises a plurality of grains extending to cross one another, and
    wherein the plurality of grains extend along a diagonal direction with respect to a boundary line extending between the first area and the second area.

12. The display device of claim 11, wherein the light shielding tape further comprises a second light shielding layer disposed between the resin base layer and the textile base layer, wherein the second light shielding layer includes black pigment.

13. The display device of claim 11, wherein a gap is formed between the first sub-chassis and the second sub-chassis, and
    wherein the light shielding tape covers the gap.

14. A light shielding tape comprising:
    a first adhesive layer;
    a textile base layer disposed on the first adhesive layer and including a first plurality of grains extending in a first direction and a second plurality of grains extending in a second direction crossing the first direction;
    a resin base layer disposed on the textile base layer;

a first light shielding layer disposed on the resin base layer; and a first area and a second area adjacent to the first area, wherein angles between the first plurality of grains and a boundary line extending between the first area and the second area are greater than 0 and less than 90 degrees.

* * * * *